(12) United States Patent
Cheng et al.

(10) Patent No.: US 12,148,613 B2
(45) Date of Patent: Nov. 19, 2024

(54) SEMICONDUCTOR STRUCTURES AND MANUFACTURING METHODS THEREOF

(71) Applicant: ENKRIS SEMICONDUCTOR, INC., Jiangsu (CN)

(72) Inventors: Kai Cheng, Jiangsu (CN); Liyang Zhang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 240 days.

(21) Appl. No.: 17/779,474

(22) PCT Filed: Apr. 15, 2021

(86) PCT No.: PCT/CN2021/087493
§ 371 (c)(1),
(2) Date: May 24, 2022

(87) PCT Pub. No.: WO2022/217542
PCT Pub. Date: Oct. 20, 2022

(65) Prior Publication Data
US 2023/0343589 A1  Oct. 26, 2023

(51) Int. Cl.
*H01L 21/02* (2006.01)
*H01L 21/308* (2006.01)
(Continued)

(52) U.S. Cl.
CPC .... *H01L 21/0254* (2013.01); *H01L 21/02164* (2013.01); *H01L 21/0217* (2013.01);
(Continued)

(58) Field of Classification Search
CPC .......... H01L 21/0254; H01L 21/02164; H01L 21/0217; H01L 21/02381; H01L 21/02433;
(Continued)

(56) References Cited

U.S. PATENT DOCUMENTS 6,107,177 A * 8/2000 Lu ..................... H01L 21/31144
438/700
6,177,688 B1 * 1/2001 Linthicum ............ C30B 29/406
257/190
(Continued)

FOREIGN PATENT DOCUMENTS

CN    103681795 A    3/2014
CN    105990255 A    10/2016
(Continued)

OTHER PUBLICATIONS

ISA State Intellectual Property Office of the People's Republic of China, International Search Report Issued in Application No. PCT/CN2021/087493, Jan. 12, 2022, WIPO, 6 pages.
(Continued)

*Primary Examiner* — Dale E Page
*Assistant Examiner* — Quovaunda Jefferson
(74) *Attorney, Agent, or Firm* — Christopher R. Carroll; The Small Patent Law Group LLC

(57) ABSTRACT

The disclosure provides a semiconductor structure and a manufacturing method thereof.
The semiconductor structure includes: a first group III nitride epitaxial layer disposed on a support substrate, a silicon substrate, a bonding layer and a second group III nitride epitaxial layer; wherein the first group III nitride epitaxial layer is bonded to the silicon substrate by the bonding layer; through-silicon-vias are formed in the silicon substrate, and first through-holes are formed in the bonding layer, wherein the through-silicon-vias communicate with the first through-holes; and the second group III nitride epitaxial layer is disposed within the first through-holes and the through-silicon-vias and on the silicon substrate, wherein the second group III nitride epitaxial layer is coupled to the first group III nitride epitaxial layer.

19 Claims, 4 Drawing Sheets

(51) Int. Cl.
*H01L 21/768* (2006.01)
*H01L 23/48* (2006.01)

(52) U.S. Cl.
CPC .. *H01L 21/02381* (2013.01); *H01L 21/02433* (2013.01); *H01L 21/3081* (2013.01); *H01L 21/3086* (2013.01); *H01L 21/76898* (2013.01); *H01L 23/481* (2013.01)

(58) Field of Classification Search
CPC ............. H01L 21/3081; H01L 21/3086; H01L 21/76898; H01L 21/02458; H01L 21/02639; H01L 21/02642; H01L 23/481; H01L 29/30
See application file for complete search history.

(56) References Cited

U.S. PATENT DOCUMENTS

| | | | |
|---|---|---|---|
| 7,566,913 B2 * | 7/2009 | Therrien | H01L 29/872 257/191 |
| 9,368,604 B1 | 6/2016 | Dal et al. | |
| 9,922,826 B2 | 3/2018 | Dasgupta et al. | |
| 2002/0192959 A1 | 12/2002 | Shibata et al. | |
| 2008/0099785 A1 | 5/2008 | Bai et al. | |
| 2014/0349427 A1 | 11/2014 | El-Ghoroury et al. | |
| 2015/0097194 A1 * | 4/2015 | Cheng | H01L 29/2003 438/172 |
| 2017/0352532 A1 | 12/2017 | Dasgupta et al. | |
| 2021/0265528 A1 | 8/2021 | Zhao et al. | |

FOREIGN PATENT DOCUMENTS

| | | |
|---|---|---|
| CN | 107004670 A | 8/2017 |
| CN | 111146320 A | 5/2020 |

OTHER PUBLICATIONS

ISA State Intellectual Property Office of the People's Republic of China, Written Opinion of the International Searching Authority Issued in Application No. PCT/CN2021/087493, Jan. 12, 2022, 2021, WIPO, 6 pages.(Submitted with Machine/Partial Translation).

* cited by examiner

SEMICONDUCTOR STRUCTURES AND MANUFACTURING METHODS THEREOF

This application is a national phase entry of and claims priority to International Patent Application No. PCT/CN2021/087493 (filed 15 Apr. 2021), the entire disclosure of which is incorporated herein by reference.

TECHNICAL FIELD

The present disclosure relates to the field of semiconductor technologies, and to a semiconductor structure and a manufacturing method thereof.

BACKGROUND

A group III nitride is the third generation of new semiconductor material after the first and second generation of semiconductor materials such as Si and GaAs, and has many advantages such as high saturation drift rate, high breakdown voltage, and excellent carrier transport performance, etc. In view of this, the group III nitride material and semiconductor device have been widely and deeply researched in recent years, and Metal-organic Chemical Vapor Deposition (MOCVD) technology for growing the group III nitride material has become increasingly mature. In terms of semiconductor device research, the research on optoelectronic devices such as group III nitride light-emitting diode (LED), laser direct structure (LDS), as well as microelectronic devices such as group III nitride High Electron Mobility Transistor (HEMT) has made significant achievement and development.

With the progressive application of the group III nitride material in power devices/display devices, the demand for dislocation density of the group III nitride material for terminal products has further increased.

SUMMARY

The present disclosure aims to provide a semiconductor structure and a manufacturing method thereof to reduce the dislocation density of the group III nitride material.

To this object, according to a first aspect of the present disclosure, a manufacturing method of a semiconductor structure is provided, the manufacturing method includes:
  providing respectively a first group III nitride epitaxial layer disposed on a support substrate and a silicon substrate, where a bonding layer is provided between the first group III nitride epitaxial layer and the silicon substrate, and the first group III nitride epitaxial layer is bonded to the silicon substrate by the bonding layer;
  patterning the silicon substrate and the bonding layer to respectively form through-silicon-vias and first through-holes, where the first group III nitride epitaxial layer is exposed through the first through-holes, and the through-silicon-vias communicate with the first through-holes; and
  growing epitaxially the first group III nitride epitaxial layer to form a second group III nitride epitaxial layer within the first through-holes and the through-silicon-vias and on the silicon substrate which is patterned.

Optionally, each of the through-silicon-vias has a depth to width ratio greater than 4:1.

Optionally, before forming the second group III nitride epitaxial layer, a patterned dielectric layer is formed on the patterned silicon substrate.

Optionally, before patterning the silicon substrate to form the through-silicon-vias, a dielectric layer is formed on a side of the silicon substrate away from the first group III nitride epitaxial layer; wherein the dielectric layer and the silicon substrate are patterned in a same process, or the dielectric layer is first patterned, and then the silicon substrate is etched with the dielectric layer, which is patterned, as a mask.

Optionally, the silicon substrate includes single crystal silicon with <100> orientation.

Optionally, a material of the dielectric layer includes at least one of silicon dioxide, silicon nitride or aluminum trioxide.

Optionally, a material of the bonding layer includes silicon dioxide or silicon nitride.

Optionally, the first group III nitride epitaxial layer and the second group III nitride epitaxial layer have a same material which includes at least one of GaN, AlN, AlGaN, InGaN or AlInGaN.

Optionally, a material of the support substrate comprises at least one of sapphire, silicon carbide or silicon.

According to a second aspect of the present disclosure, a semiconductor structure is provided, the semiconductor structure includes:
  a first group III nitride epitaxial layer disposed on a support substrate and a silicon substrate; a bonding layer between the first group III nitride epitaxial layer and the silicon substrate, wherein the first group III nitride epitaxial layer is bonded to the silicon substrate by the bonding layer; through-silicon-vias formed in the silicon substrate, and first through-holes formed in the bonding layer, wherein the through-silicon-vias communicate with the first through-holes; and
  a second group III nitride epitaxial layer within the first through-holes and the through-silicon-vias and on the silicon substrate, wherein the second group III nitride epitaxial layer is coupled to the first group III nitride epitaxial layer.

Optionally, each of the through-silicon-vias has a depth to width ratio greater than 4:1.

Optionally, a material of the support substrate includes at least one of sapphire, silicon carbide or silicon.

Optionally, a dielectric layer is provided between the second group III nitride epitaxial layer and the silicon substrate.

Optionally, a material of the dielectric layer includes at least one of silicon dioxide, silicon nitride or aluminum trioxide.

Optionally, a material of the bonding layer includes silicon dioxide or silicon nitride.

Optionally, the first group III nitride epitaxial layer and the second group III nitride epitaxial layer have a same material which comprise at least one of GaN, AlN, AlGaN, InGaN or AlInGaN.

Compared with the related art, the present disclosure has the following beneficial effects.
  1) The silicon substrate is bonded to the first group III nitride epitaxial layer, due to the mature process of the silicon substrate and its relatively thick thickness, the depth to width ratio of the through-silicon-via(s) formed therein is generally relatively great, such that the dislocation extension within the second group III nitride epitaxial layer is limited when the first group III nitride epitaxial layer is epitaxially grown to form the second group III nitride epitaxial layer. As a result, the probability of dislocation annihilation in the interior and sidewalls of the through-silicon-via(s) is increased, and the second III nitride epitaxial layer with low dislocation density can be formed, such that the quality of the second III nitride epitaxial layer is improved.

2) In optional embodiments, the depth to width ratio of the through-silicon-via(s) is greater than 4:1. The above depth to width ratio can further limit the dislocation extension in the second group III nitride epitaxial layer and increase the probability of dislocation annihilation in the interior and sidewalls of the through-silicon-via (s).

3) In optional embodiments, a) a patterned dielectric layer is formed on the patterned silicon substrate before the second group III nitride epitaxial layer is epitaxially grown. The patterned dielectric layer may be formed by thermal oxidation. Or, b) a dielectric layer is formed on a side of the silicon substrate away from the first group III nitride epitaxial layer before through-silicon-vias are formed by patterning the silicon substrate; the dielectric layer and the silicon substrate are patterned in the same process, or the dielectric layer is patterned first and then the silicon substrate is etched with the patterned dielectric layer as a mask. The dielectric layer can improve the growth performance of the second group III nitride epitaxial layer on the silicon substrate, especially on the single crystal silicon substrate with <100> orientation, by the material which is selected.

Figure 1:
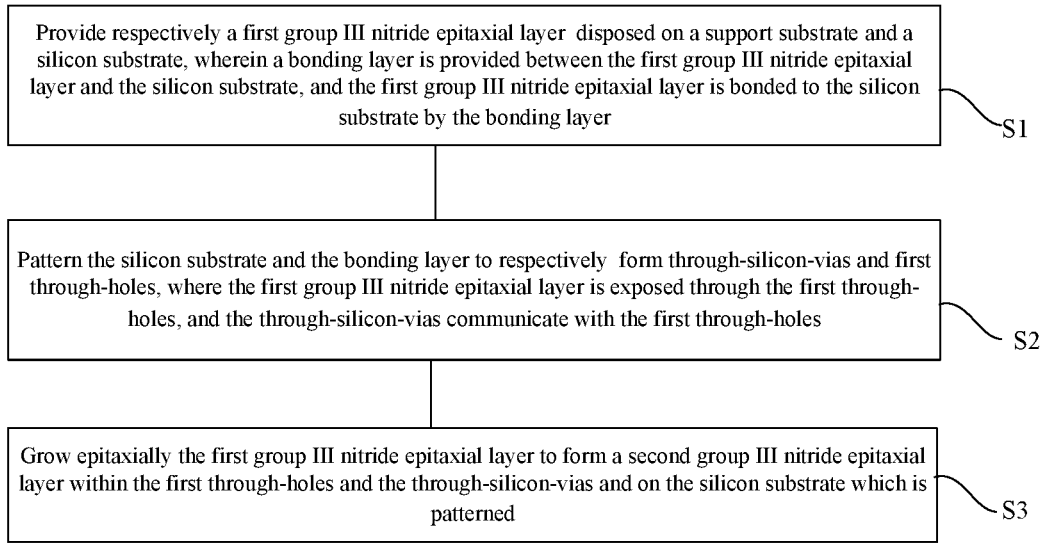
FIG. 1 is a flowchart illustrating a manufacturing method of a semiconductor structure according to a first embodiment of the present disclosure.

For the convenience of understanding of the present disclosure, all reference numerals appearing in the present disclosure are listed below:
semiconductor structure 1, 2;
support substrate 10;
first group III nitride epitaxial layer 11;
second group III nitride epitaxial layer 12;
dielectric layer 13;
silicon substrate 20;
bonding layer 30;
through-silicon-via 20a;
first through-hole 30a.

DETAILED DESCRIPTION OF THE EMBODIMENTS

To make the forgoing objectives, features and advantages of the present disclosure clearer and more comprehensible, the following describes the specific embodiments of the present disclosure in detail with reference to the accompanying drawings.

FIG. 1 is a flowchart illustrating a manufacturing method of a semiconductor structure according to a first embodiment of the present disclosure; FIGS. 2 to 5 are schematic structural diagrams illustrating intermediate structures corresponding to steps of FIG. 1; FIG. 6 is a schematic structural diagram illustrating a cross-section of the semiconductor structure according to the first embodiment of the present disclosure.

Figure 2:
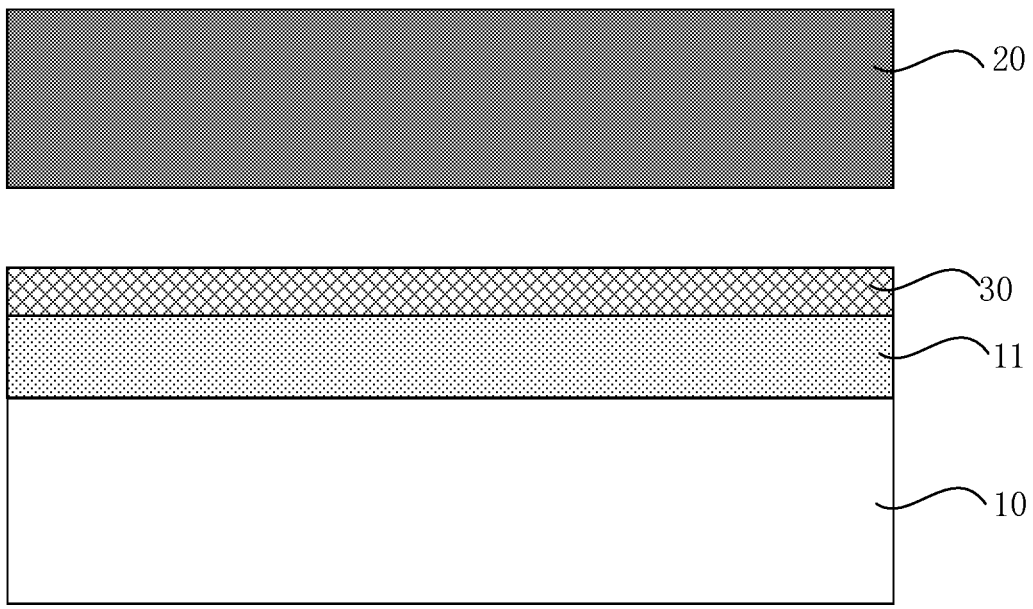
FIGS. 2 to 5 are schematic structural diagrams illustrating intermediate structures corresponding to steps of FIG. 1.
Figure 3:
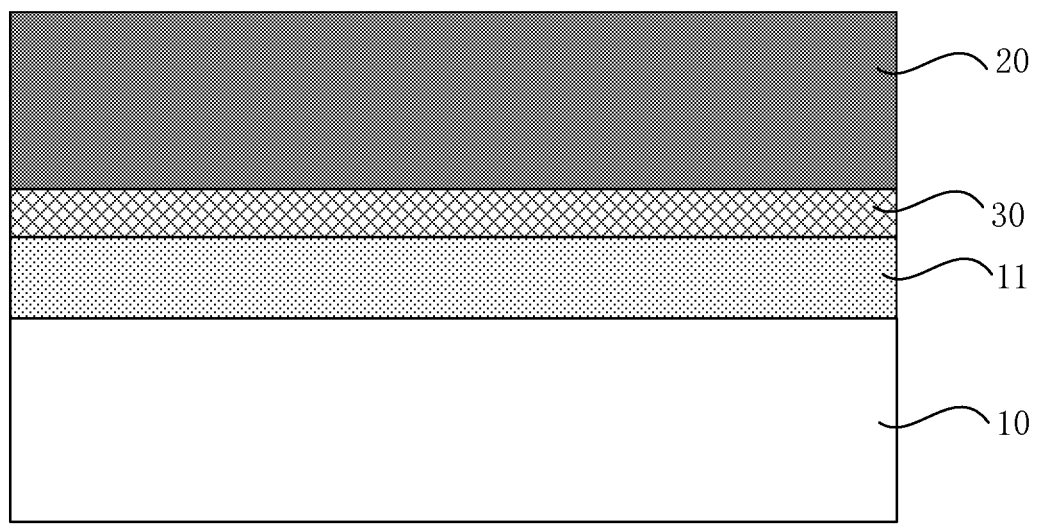

First, referring to step S1 in FIG. 1 and FIG. 2, a first group III nitride epitaxial layer 11 disposed on a support substrate 10 and a silicon substrate 20 are provided, respectively. A bonding layer 30 is provided between the first group III nitride epitaxial layer 11 and the silicon substrate 20. As shown in FIG. 3, the first group III nitride epitaxial layer 11 is bonded to the silicon substrate 20 by the bonding layer 30.

The support substrate 10 may include at least one of sapphire, silicon carbide or silicon, or include at least one of sapphire, silicon carbide or silicon and group III nitride thereon, which is limited by the embodiment.

A material of the first group III nitride epitaxial layer 11 may include at least one of GaN, AlGaN, InGaN or AlInGaN.

It should be noted that, in this embodiment, a chemical element is used to represent a material, without limiting the molar ratio of each chemical element in the material. For example, the GaN material includes Gallium (Ga) and Nitrogen (N) elements, but molar ratios of the Ga and N elements are not limited. The AlGaN material includes Aluminium (Al), Ga, and N elements, but molar ratios of the Al, Ga, and N elements are not limited.

The first group III nitride epitaxial layer 11 has dislocations, which mainly include linear dislocations with <0001> orientation, i.e., dislocations extending in the thickness direction of the first group III nitride epitaxial layer 11.

The silicon substrate 20 may be single crystal silicon with <100> orientation, single crystal silicon with <110> orientation, single crystal silicon with <111> orientation, etc.

In this embodiment, as shown in FIG. 2, the bonding layer 30 is formed on the first group III nitride epitaxial layer 11. A material of the bonding layer 30 may be silicon nitride or silicon dioxide, which may be formed, for example, by physical vapor deposition or chemical vapor deposition.

In another embodiment, the bonding layer 30 is provided for the silicon substrate 20, or both the silicon substrate 20 and the first group III nitride epitaxial layer 11 are provided with the bonding layer 30.

In yet another embodiment, the bonding layer 30 may be provided separately, i.e., neither provided for the silicon substrate 20 nor formed on the first group III nitride epitaxial layer 11. The material of the bonding layer 30 may include a metal.

The thickness of the bonding layer 30 may range from 0.01 μm to 2 μm.

The first group III nitride epitaxial layer 11 and the silicon substrate 20 may be bonded together by high temperature and high pressure. Alternatively, a positive voltage may also be applied to one of the first group III nitride epitaxial layer 11 and the silicon substrate 20, a negative voltage is applied to the other of the first group III nitride epitaxial layer 11 and the silicon substrate 20, and then the first group III nitride epitaxial layer 11 and the silicon substrate 20 are bonded together.

In the bonding process, the support substrate 10 may serve to support the first group III nitride epitaxial layer 11.

Figure 4:
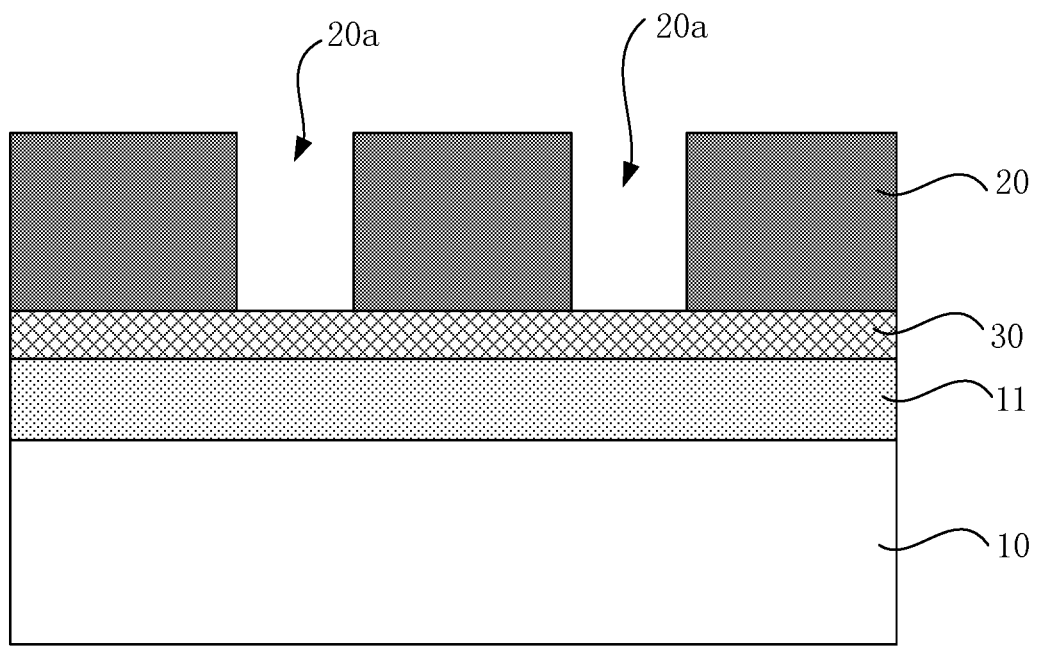
Figure 5:
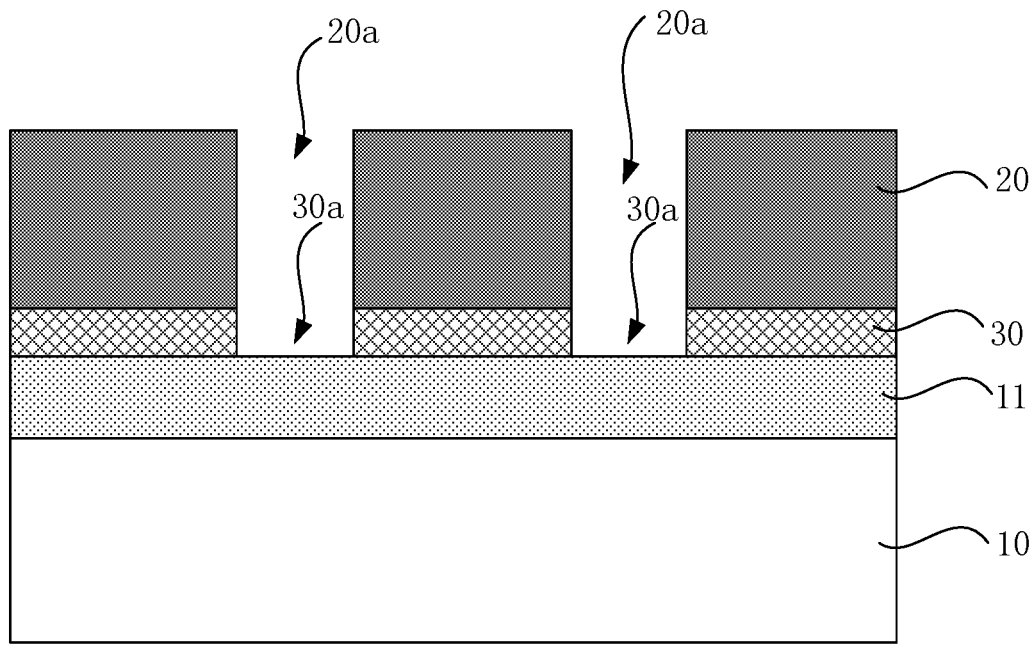
Figure 6:
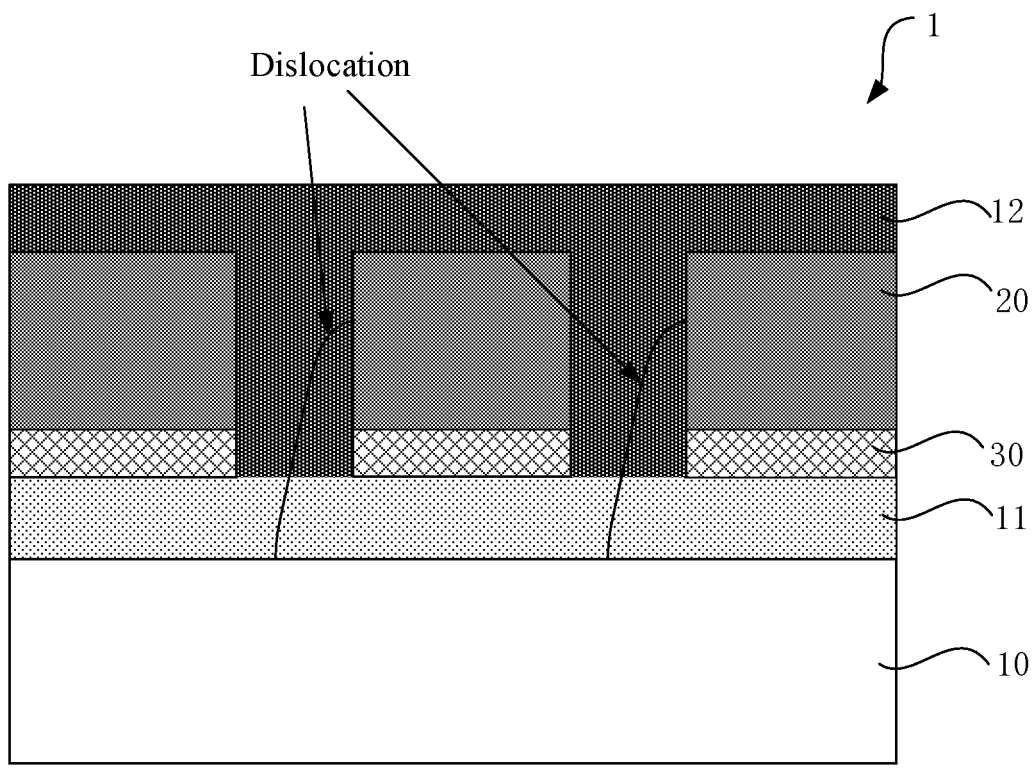
FIG. 6 is a schematic structural diagram illustrating a cross-section of the semiconductor structure according to the first embodiment of the present disclosure.

Next, referring to step S2 in FIG. 1, FIG. 4 and FIG. 5, the silicon substrate 20 is patterned to form several through-silicon-vias 20a, and the bonding layer 30 is patterned to form several first through-holes 30a. The first through-holes 30a expose the first III-nitride epitaxial layer 11, and the through-silicon-vias 20a communicate with the first through-holes 30a.

Referring to FIG. 5, the silicon substrate 20 and the bonding layer 30 may be patterned in one step of dry etching process. Referring to FIG. 4, alternatively, the silicon substrate 20 may be patterned first to form the through-silicon-vias 20a, and then the bonding layer 30 is dry etched with the patterned silicon substrate 20 as a mask to form the first through-holes 30a.

The thickness of the silicon substrate 20 is relatively thick, and a depth to width ratio of each of the through-silicon-vias 20a formed therein is generally relatively great, for example, greater than 4:1.

Afterwards, referring to step S3 in FIG. 1 and FIG. 6, the first group III nitride epitaxial layer 11 is epitaxially grown to form the second group III nitride epitaxial layer 12 within the first through-holes 30a and the through-silicon-vias 20a and on the silicon substrate 20 which is patterned.

The epitaxial growth process of the second group III nitride epitaxial layer 12 may include at least one of: atomic layer deposition (ALD), chemical vapor deposition (CVD), molecular beam epitaxy (MBE), plasma enhanced chemical vapor deposition (PECVD), low pressure chemical vapor deposition (LPCVD), or metal organic compound chemical vapor deposition (MOCCVD).

Since the through-silicon-vias 20a respectively have a relatively great depth to width ratio, the extension of dislocations in the second III-nitride epitaxial layer 12 can be limited, such that more dislocations are annihilated in the interior or sidewalls of the through-silicon-vias 20a, thereby the second group III nitride epitaxial layer 12 with low dislocation density can be formed, and the quality of the epitaxial layer is improved.

During the epitaxial growth of the second group III nitride epitaxial layer 12, P-type dopant ions or N-type dopant ions may be doped. The P-type doping ions may include at least one of Mg (Magnesium) ions, Zn (Zinc) ions, Ca (Calcium) ions, Sr (Strontium) ions or Ba (Barium) ions, and the N-type doping ions may include at least one of Si (Silicon) ions, Ge (Germanium) ions, Sn (Stannum) ions, Se (Selenium) ions or Te (Tellurium) ions. In-situ doping method may be used, i.e., doping while growing.

The second group III nitride epitaxial layer 12 and the first group III nitride epitaxial layer 11 may have a same material or different materials, which include at least one of GaN, AlN, AlGaN, InGaN or AlInGaN.

Referring to FIG. 6 and FIG. 5, the semiconductor structure 1 of the first embodiment includes:
- a first group III nitride epitaxial layer 11 disposed on a support substrate 10 and a silicon substrate 20; a bonding layer 30 between the first group III nitride epitaxial layer 11 and the silicon substrate 20, where the first group III nitride epitaxial layer 11 is bonded to the silicon substrate 20 by the bonding layer 30; several through-silicon-vias 20a formed in the silicon substrate 20; several first through-holes 30a formed in the bonding layer 30, where the several through-silicon-vias 20a communicate with the several first through-holes 30a; and
- a second group III nitride epitaxial layer 12 within the several first through-holes 30a and the several through-silicon-vias 20a and on the silicon substrate 20, where the second group III nitride epitaxial layer 12 is coupled to the first group III nitride epitaxial layer 11.

Figure 7:
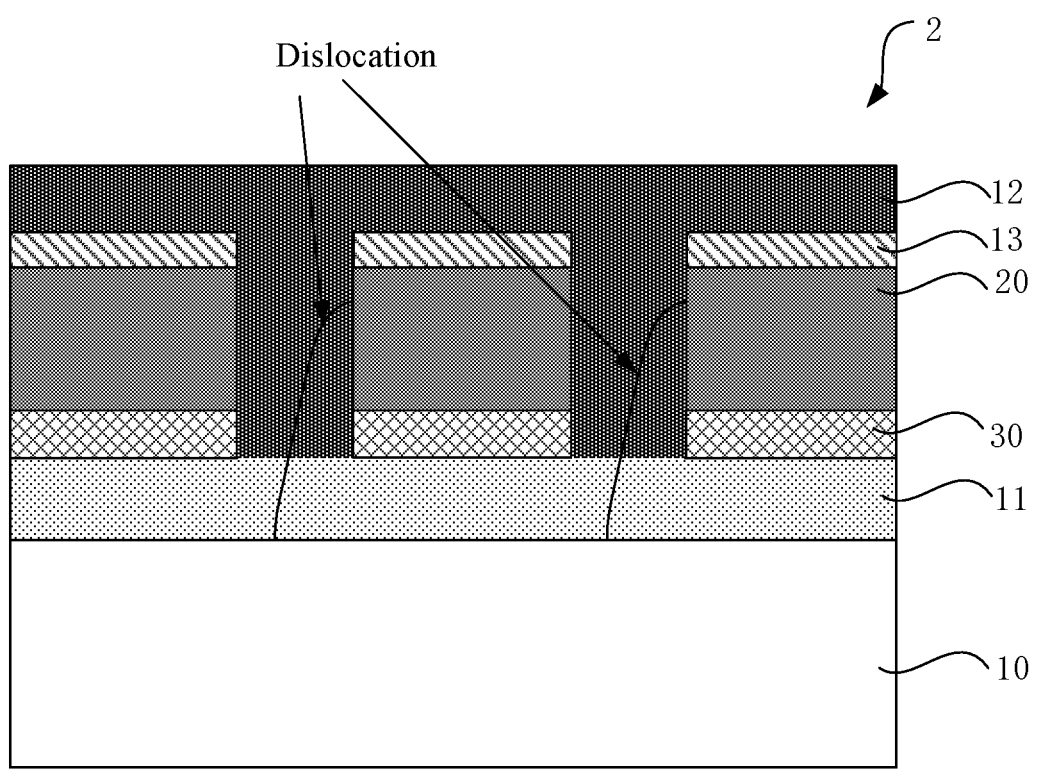
FIG. 7 is a schematic structural diagram illustrating a cross-section of a semiconductor structure according to a second embodiment of the present disclosure.

FIG. 7 is a schematic structural diagram illustrating a cross-section of a semiconductor structure according to a second embodiment of the present disclosure.

Referring to FIG. 7, a semiconductor structure 2 of the second embodiment is substantially the same as the semiconductor structure 1 of the first embodiment, the difference between the first embodiment and the second embodiment is merely that there is a dielectric layer 13 between the second group III nitride epitaxial layer 12 and the silicon substrate 20 in the second embodiment.

A material of the dielectric layer 13 may include at least one of silicon dioxide, silicon nitride or aluminum oxide.

Correspondingly, the manufacturing method of this embodiment is substantially the same as the manufacturing method of the previous embodiment, the difference is merely that there is a step, between step S1 and step S2, of forming the dielectric layer 13 on a side of the silicon substrate 20 far away from the first group III nitride epitaxial layer 11. The dielectric layer 13 may be formed by physical vapor deposition, chemical vapor deposition or atomic layer deposition. In an optional embodiment, at step S2, the dielectric layer 13 and the silicon substrate 20 may be patterned in the same process, for example, by one step of dry etching or wet etching. In another optional embodiment, at step S2, the dielectric layer 13 is patterned first, and then the silicon substrate 20 is etched with the patterned dielectric layer 13 as a mask.

The difference between the manufacturing method of this embodiment and the manufacturing method of the previous embodiments is merely that there is a step, between step S2 and step S3, of forming a patterned dielectric layer 13 on the patterned silicon substrate 20. For example, the dielectric layer 13 is formed by thermally oxidizing the silicon substrate 20.

The dielectric layer 13 can improve the growth performance of the second group III nitride epitaxial layer 12 on the silicon substrate 20, especially on the single crystal silicon substrate 20 with <100> orientation, by the material which is selected.

Although the present disclosure is disclosed above, the present disclosure is not limited thereto. Any person skilled in the art can make various changes and modifications without departing from the spirit and scope of the present disclosure. Therefore, the scope of the present disclosure should be based on the scope defined by the claims.

The invention claimed is:

1. A manufacturing method of a semiconductor structure, comprising:
   providing respectively a first group III nitride epitaxial layer disposed on a support substrate and a silicon substrate, wherein a bonding layer is provided between the first group III nitride epitaxial layer and the silicon substrate, a material of the bonding layer comprises silicon dioxide or silicon nitride, and the first group III nitride epitaxial layer is bonded to the silicon substrate by the bonding layer;
   patterning the silicon substrate and the bonding layer to respectively form through-silicon-vias and first through-holes, wherein the first group III nitride epitaxial layer is exposed through the first through-holes, and the through-silicon-vias communicate with the first through-holes; and
   growing epitaxially the first group III nitride epitaxial layer to form a second group III nitride epitaxial layer within the first through-holes and the through-silicon-vias and on the silicon substrate which is patterned.

2. The manufacturing method of claim 1, wherein each of the through-silicon-vias has a depth to width ratio greater than 4:1.

3. The manufacturing method of claim 1, wherein before forming the second group III nitride epitaxial layer, a dielectric layer which is patterned is formed on the silicon substrate which is patterned.

4. The manufacturing method of claim 3, wherein a material of the dielectric layer comprises at least one of silicon dioxide, silicon nitride or aluminum trioxide.

5. The manufacturing method of claim 1, further comprising: before patterning the silicon substrate to form the through-silicon-vias,
forming a dielectric layer on a side of the silicon substrate away from the first group III nitride epitaxial layer; wherein the dielectric layer and the silicon substrate are patterned in a same process, or the dielectric layer is first patterned, and then the silicon substrate is etched with the dielectric layer, which is patterned, as a mask.

6. The manufacturing method of claim 1, wherein the silicon substrate comprises single crystal silicon with <100> orientation.

7. The manufacturing method of claim 1, wherein materials of the first group III nitride epitaxial layer and the second group III nitride epitaxial layer comprise at least one of GaN, AlN, AlGaN, InGaN or AlInGaN.

8. A semiconductor structure, comprising:
a first group III nitride epitaxial layer disposed on a support substrate and a silicon substrate;
a bonding layer between the first group III nitride epitaxial layer and the silicon substrate, wherein a material of the bonding layer comprises silicon dioxide or silicon nitride, and the first group III nitride epitaxial layer is bonded to the silicon substrate by the bonding layer;
through-silicon-vias formed in the silicon substrate;
first through-holes formed in the bonding layer, wherein the through-silicon-vias communicate with the first through-holes; and
a second group III nitride epitaxial layer within the first through-holes and the through-silicon-vias and on the silicon substrate, wherein the second group III nitride epitaxial layer is coupled to the first group III nitride epitaxial layer.

9. The semiconductor structure of claim 8, wherein each of the through-silicon-vias has a depth to width ratio greater than 4:1.

10. The semiconductor structure of claim 8, wherein a material of the support substrate comprises at least one of sapphire, silicon carbide or silicon.

11. The semiconductor structure of claim 8, wherein a dielectric layer is provided between the second group III nitride epitaxial layer and the silicon substrate.

12. The semiconductor structure of claim 11, wherein a material of the dielectric layer comprises at least one of silicon dioxide, silicon nitride or aluminum trioxide.

13. The semiconductor structure of claim 8, wherein the first group III nitride epitaxial layer and the second group III nitride epitaxial layer have a same material which comprise at least one of GaN, AlN, AlGaN, InGaN or AlInGaN.

14. A manufacturing method of a semiconductor structure, comprising:
providing respectively a first group III nitride epitaxial layer disposed on a support substrate and a silicon substrate, wherein the silicon substrate comprises single crystal silicon with <100> orientation, a bonding layer is provided between the first group III nitride epitaxial layer and the silicon substrate, and the first group III nitride epitaxial layer is bonded to the silicon substrate by the bonding layer;
patterning the silicon substrate and the bonding layer to respectively form through-silicon-vias and first through-holes, wherein the first group III nitride epitaxial layer is exposed through the first through-holes, and the through-silicon-vias communicate with the first through-holes; and
growing epitaxially the first group III nitride epitaxial layer to form a second group III nitride epitaxial layer within the first through-holes and the through-silicon-vias and on the silicon substrate which is patterned.

15. The manufacturing method of claim 14, wherein each of the through-silicon-vias has a depth to width ratio greater than 4:1.

16. The manufacturing method of claim 14, wherein before forming the second group III nitride epitaxial layer, a dielectric layer which is patterned is formed on the silicon substrate which is patterned.

17. The manufacturing method of claim 14, further comprising: before patterning the silicon substrate to form the through-silicon-vias,
forming a dielectric layer on a side of the silicon substrate away from the first group III nitride epitaxial layer; wherein the dielectric layer and the silicon substrate are patterned in a same process, or the dielectric layer is first patterned, and then the silicon substrate is etched with the dielectric layer, which is patterned, as a mask.

18. The manufacturing method of claim 16, wherein a material of the dielectric layer comprises at least one of silicon dioxide, silicon nitride or aluminum trioxide.

19. The manufacturing method of claim 14, wherein materials of the first group III nitride epitaxial layer and the second group III nitride epitaxial layer comprise at least one of GaN, AlN, AlGaN, InGaN or AlInGaN.

* * * * *